(12) United States Patent
Yang

(10) Patent No.: US 7,429,499 B2
(45) Date of Patent: Sep. 30, 2008

(54) METHOD OF FABRICATING WAFER LEVEL PACKAGE

(75) Inventor: Kuo-Pin Yang, Meinong Township, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 528 days.

(21) Appl. No.: 11/292,541

(22) Filed: Dec. 2, 2005

(65) Prior Publication Data

US 2006/0252178 A1    Nov. 9, 2006

(30) Foreign Application Priority Data

May 3, 2005    (TW) ............... 94114294 A

(51) Int. Cl.
*H01L 21/00* (2006.01)
(52) U.S. Cl. ............... 438/110; 438/106; 438/455; 438/460; 257/E21.122
(58) Field of Classification Search ............... 438/55; 257/E21.48
See application file for complete search history.

(56) References Cited

U.S. PATENT DOCUMENTS

2006/0252230 A1*  11/2006  Yang ............... 438/455
2007/0045780 A1*  3/2007   Akram et al. ............... 257/621

* cited by examiner

Primary Examiner—Charles D. Garber
Assistant Examiner—Cheung Lee
(74) Attorney, Agent, or Firm—Thomas, Kayden, Horstemeyer & Risley

(57) ABSTRACT

A method of fabricating wafer level package is provided. The method includes the following steps. Firstly, a wafer having a front surface and a rear surface is provided, and the front surface has several conductive pads. Next, a supporting material is attached on the front surface. Then, several holes are formed on the wafer, and the holes run from the rear surface to the front surface. A first substrate is attached on the rear surface. The first substrate has several conductive pillars correspondingly inserted into the holes. Afterwards, the supporting material is removed to expose the conductive pillars on the front surface, and a patterned circuit is formed on the front surface. Next, a second substrate is attached on the patterned circuit. Then, several conductive structures are formed on the first substrate.

13 Claims, 3 Drawing Sheets

METHOD OF FABRICATING WAFER LEVEL PACKAGE

This application claims the benefit of Taiwan application Serial No. 94114294, filed May 3, 2005, the subject matter of which is incorporated herein by reference.

BACKGROUND OF THE INVENTION

1. Field of the Invention

The invention relates in general to a packaging method, and more particularly to a method of fabricating wafer level package.

2. Description of the Related Art

Along with the advance in electronic technology, high-tech electronic products become available in the market one after another. The main purpose of package industry is to support the research and development of electronic products and assure that the speed of semiconductor packages continues to increase, that the functions of the semiconductor packages are fully availed, and that the electronic products incorporating the semiconductor packages posses the advantages of slimness, lightweight and compactness. In order to meet these requirements, the development of the semiconductor packages is headed towards: increasing the number of input/output (I/O) pads, speeding the transmission of signals, boosting the power, shortening the pitches, increasing the connecting efficiency (the ratio of the size of the chip inside the package to the size of the package), lightening, thinning and miniaturizing the size. Apart from that, a package with good heat dissipation and multiple chips is also highly demanded.

Current markets of electronic products are focused on the feature of portability. For example, electronic products such as notebook computer and personal digital assistant (PDA) have gradually become indispensable electronic products to modern people. To be applicable to the high space density of mobile electronic products, the memory module needs to maintain high efficiency and stable quality. Therefore, how to reduce module space and yet remain high quality or even increase data transmission efficiency has become an imminent issue to be resolved. However, conventional chip level package technology is unable to meet the requirements of future technology, the current trend is headed towards wafer level package which possesses the advantages of low cost and high quality.

According to the technology of conventional chip level package, the chips are singulated from the wafer first and then the wafer is packaged using a molding compound and tested. The size of a packaged chip is larger than the size of a chip by 20%. According to the technology of wafer level package, the wafer is packaged and tested first before being singulated into chips, therefore the packaged chip has the same size with the chip. According to the technology of wafer level package, not only the size of memory module is reduced, but also the features of slimness, lightweight and compactness of portable electronic products can be satisfied. Besides, the circuit layout of wafer level package is shorter and thicker, thereby effectively increasing the bandwidth and stability of data transmission and reducing the loss of currents. Moreover, the wafer level package does not need the molding compound used in the technology of chip level package for the packing of plastics or ceramics, so that the heat generated by the chip is effectively dissipated, which is conducive to the resolution of heat dissipation problem of portable electronic products.

In terms of a conventional optical component, the circuit layout is mainly distributed on the front surface of the optical component, and the front surface is used for receiving external light source at the same time. When the optical component needs to be electrically connected to a substrate such as a substrate used for testing or a circuit board of an electronic product applying the same, the front surface of optical component is normally electrically connected to the substrate via wiring. The aforementioned method is applicable to the technology of chip level package, but is not applicable to the method of fabricating wafer level package. Therefore, how to apply the method of fabricating wafer level package to the aforementioned optical component so that the size is miniaturized, the data transmission is stabilized and the heat dissipation is enhanced has become an imminent challenge to be resolved.

SUMMARY OF THE INVENTION

It is therefore an object of the invention to provide a method of fabricating wafer level package, so that fabricated wafer level package unit has excellent quality. The circuits on the front surface of the wafer are conducted to the rear surface of the wafer. The rear surface of the wafer is electrically connected to an external substrate, so that the front surface of the wafer still can receives signals from an external light source.

The invention achieves the above-identified object by providing a method of fabricating wafer level package. Firstly, a wafer having a front surface and a rear surface is provided, and the front surface has several conductive pads. Next, a supporting material is attached on the front surface. Then, several holes are formed on the wafer, and the holes run from the rear surface to the front surface. A first substrate is attached on the rear surface. The first substrate has several conductive pillars correspondingly inserted into the holes of the wafer. Afterwards, the supporting material is removed to expose the conductive pillars on the front surface, and a patterned circuit is formed on the front surface. Next, a second substrate is attached on the patterned circuit. Then, several conductive structures are formed on the first substrate. Lastly, the package is singulated.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides a method of fabricating wafer level package. The main concept is to connect the circuits on the front surface of an optical component to the rear surface of the optical component and use the rear surface of the optical component as a contact point of the optical component, so that the front surface of the optical component still can receives signals from an external light source. Singulation is processed after the wafer is packaged. Then the singulated package unit is electrically connected to an external substrate, such as a substrate used for testing or a circuit board of an electronic product applying the same.

Figure 1A:
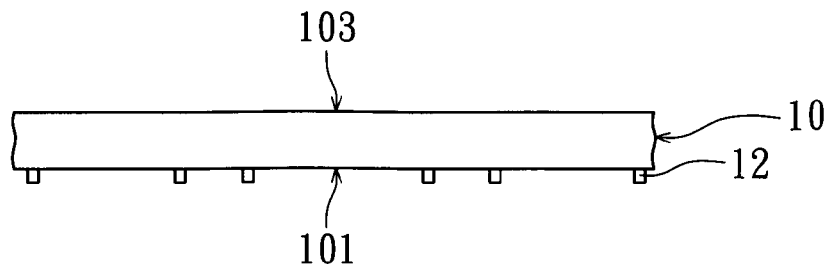
FIGS. 1A~1J are diagrams showing a method of fabricating wafer level package according to a preferred embodiment of the invention.
Figure 1B:
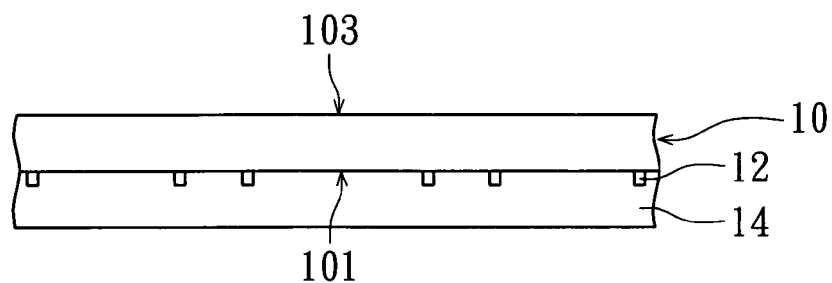

Referring to FIGS. 1A~1J, several diagrams showing a method of fabricating wafer level package according to a preferred embodiment of the invention are shown. Firstly, a wafer 10 having a front surface 101 and a rear surface 103 is provided. The front surface 101 of the wafer 10 has several conductive pads 12 as shown in FIG. 1A. The conductive pads 12 are the input/output (I/O) pads of wafer level package. Besides, the front surface 101 can be used for receiving an external light source. Afterwards, a supporting material 14 is attached on the front surface 101 of the wafer 10 as shown in FIG. 1B. The supporting material 14 includes wax, adhesive or glue. In practical application, the supporting material 14 can be printed or coated on the front surface 101 of the wafer 10.

Figure 1C:
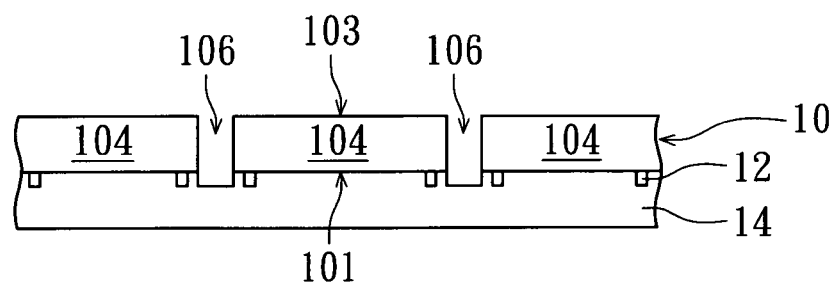
Figure 1D:
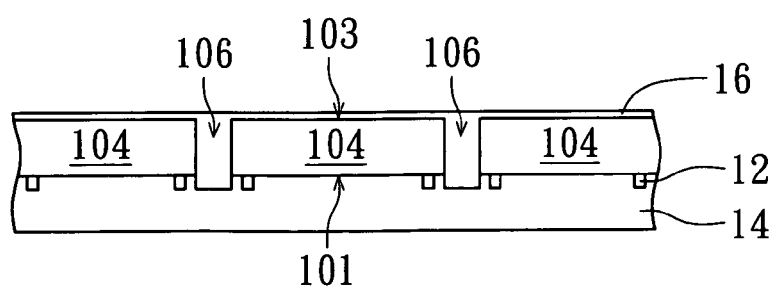

Next, several holes 106 are formed on the wafer 10, and the holes 106 run from the rear surface 103 of the wafer 10 to the front surface 101 as shown in FIG. 1C. The holes 106 are formed on the wafer 10 and are positioned between the chips 104. The holes 106 can be formed via an etching process or other singulating process. Afterwards, an adhesive 16 is coated on the rear surface 103 of the wafer 10 and fills the holes 106 as shown in FIG. 1D.

Figure 1E:
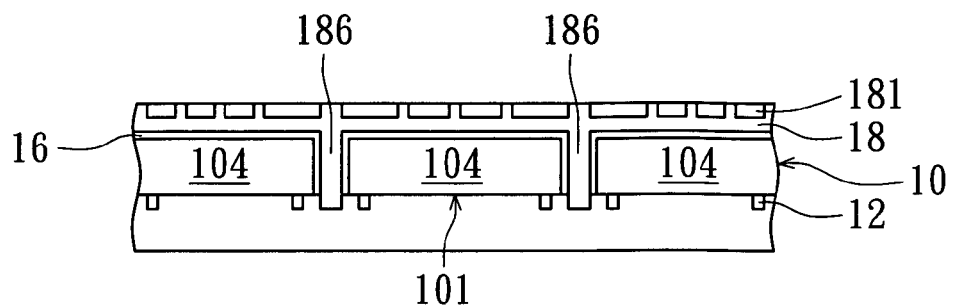

Afterwards, a first substrate 18 including a glass for instance is formed on the adhesive 16 coated on the rear surface 103 of the wafer 10. The first substrate 18 has several conductive pillars 186 correspondingly inserted into the holes 106 of the wafer 10 as shown in FIG. 1E. The conductive pillars 186 are fixed by the adhesive 16 inside the holes 106. The first substrate 18 has several contact pads 181.

Figure 1F:
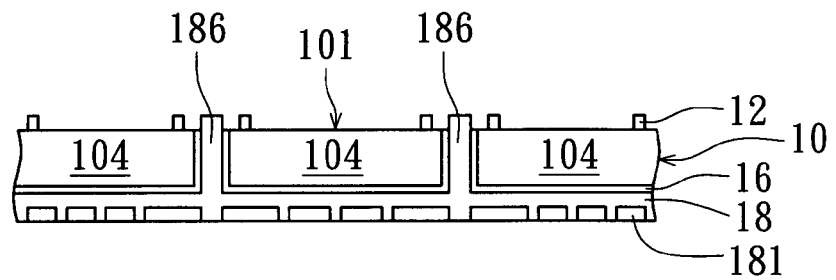

Then, the supporting material 14 is removed to expose parts of the conductive pillars 186 positioned on the front surface 101 of the wafer 10 as shown in FIG. 1F.

Figure 1G:
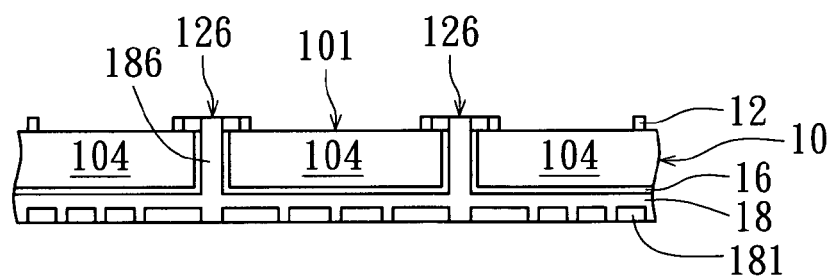

Next, a patterned circuit 126 is formed on the front surface 101 of the wafer 10 as shown in FIG. 1G. In the present preferred embodiment, a metal layer (not shown in the diagram) is formed via a sputtering method to connect the conductive pads 12 and the conductive pillars 186 exposed outside the front surface 101. The metal layer, the conductive pads 12 and the conductive pillars 186 include copper for instance.

Figure 1H:
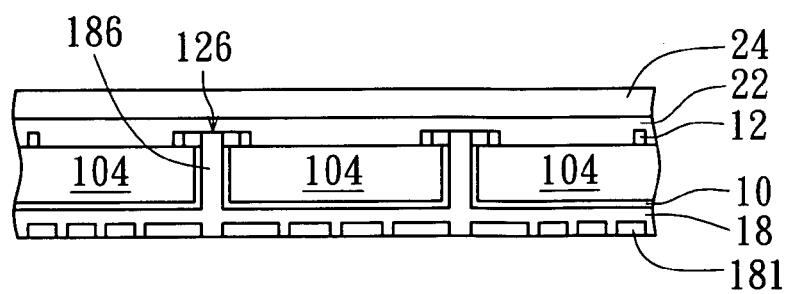

Afterwards, a second substrate 24 such as a glass is attached on the patterned circuit 126 as shown in FIG. 1H. There are several methods available, and in the present embodiment. Preferably, an optical adhesive 22 is applied on the front surface 101 of the wafer 10 and covers the patterned circuit 126. Afterwards, the second substrate 24 is attached on the optical adhesive 22. The optical adhesive 22 includes epoxy having high transparency and refraction.

Figure 1I:
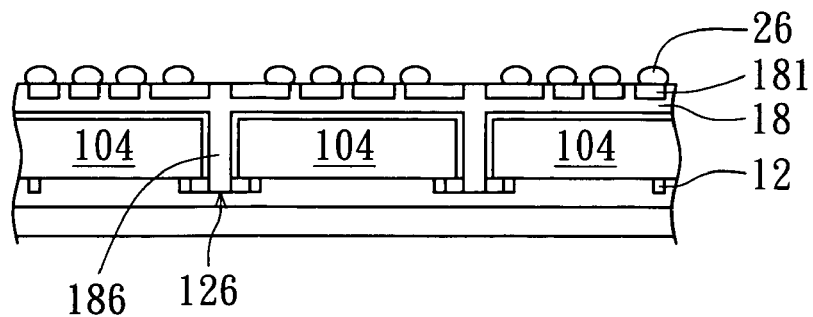
Figure 1J:
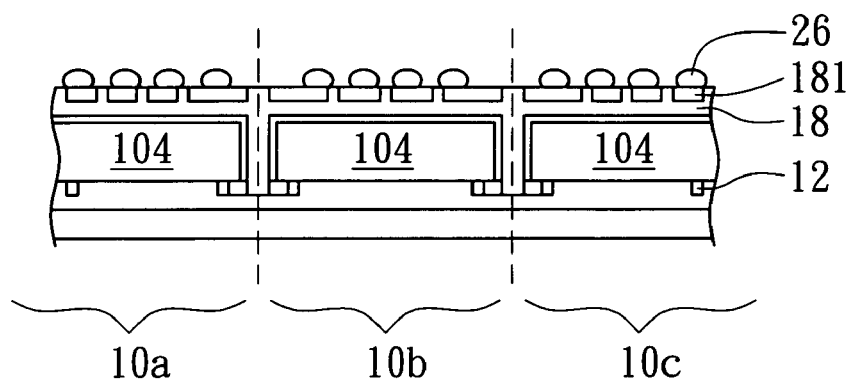

Next, several conductive structures 26 such as solder bumps are formed on the contact pad 181 of the first substrate 18 as shown in FIG. 1I. The conductive structures 26 can be electrically connected to a circuit board (not shown in the diagram). Then, the package of FIG. 1J is singulated into several package units such as package units 10a, 10b, 10c . . . and so forth.

Figure 2:
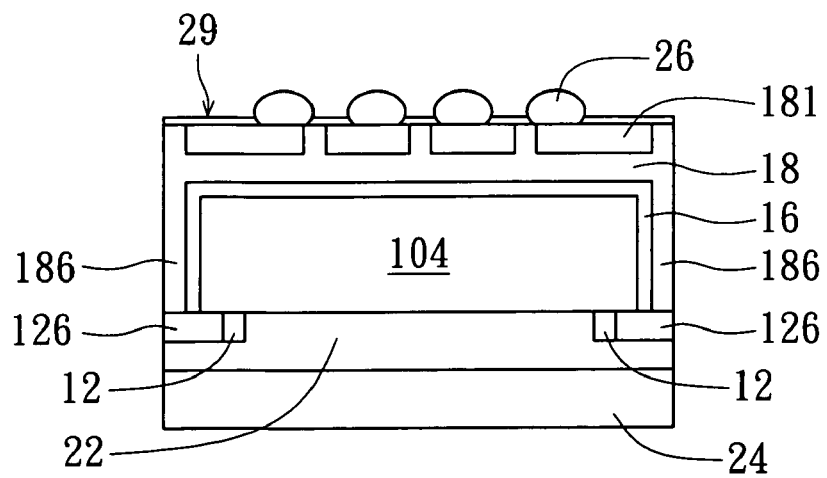
FIG. 2 is a diagram of a wafer level package unit according to the preferred embodiment of the invention.

Referring to FIG. 2, a diagram of a wafer level package unit according to the preferred embodiment of the invention is shown. In the package unit, the front surface and the rear surface of the chip 104 respectively have a first substrate 18 and a second substrate 24, and the optical adhesive 22 is used to adhere the second substrate 24 to the chip 104 together. The conductive pillars 186 positioned on the left and the right sides of the chip 104 are used for connecting the front surface and the rear surface of the chip, and the conductive pillars 186 connect the conductive pad (I/O pad) 12 positioned on the front surface of the chip to the rear surface of the chip. The adhesive 16 is filled between the conductive pillars 186 and the chip 104 for protecting the circuits and avoiding vapor damage. Besides, a solder mask 29 is formed on the first substrate 18. After the conductive structures 26 are formed, the solder mask 29 can protect the exposed parts of the contact pads 181 of the first substrate 18. The package unit can be electrically connected to an external substrate a substrate used for testing or a circuit board of an electronic product applying the same (not shown in the FIG. 2) via the conductive structures 26 (such as the solder bumps) positioned at the rear surface.

The wafer level package units fabricated according to the aforementioned fabricating method of the embodiment possess the following advantages:

(1) The holes 106 surrounding the chip 104 can be formed via the etching process or other singulating processes, and the use of the supporting material 14 supports the wafer 10 to smoothly complete the step of forming the holes 106.

(2) The front surface 101 of the wafer 10 is a photosensitive region. The front surface 101 of the wafer 10 is protected by the supporting material 14 first, then the step of forming the holes 106, filling the adhesive 16 and adhering the first substrate 18 is processed, lest the photosensitive region might be tarnished in subsequent manufacturing processes.

(3) After the supporting material 14 is removed, the first substrate 18 is used to support the wafer 10 and protect the rear surface 103 of the wafer 10, and then the manufacturing process of the front surface 101 of the wafer 10 is continued.

(4) The conductive pillars 186 positioned on the first substrate 18 are inserted into the holes 106, the circuits are connected from the front surface 101 to the rear surface 103 of the wafer 10. Signals are connected by connecting the conductive pads 12 (such as the I/O Pads) to the conductive pillars 186 via the sputtering method for instance.

(5) By filling the adhesive (such as the adhesive 16 and optical adhesive 22 for instance) around the chip 104, the circuits of the package unit are protected and the internals of the package unit are prevented from vapor damage.

A miniaturized and qualified wafer level package unit possessing the features of stable circuits and excellent dissipation and capable of resisting vapor damage can be manufactured according to the aforementioned method of fabricating wafer level package. Since the steps of the manufacturing process are simple, the manufacturing costs of the wafer level package unit can be further reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating wafer level package, comprising:
    providing a wafer having a front surface and a rear surface, wherein the front surface has a plurality of conductive pads;
    attaching a supporting material on the front surface;
    forming a plurality of holes on the wafer, wherein the holes run from the rear surface to the front surface;
    attaching a first substrate on the rear surface, wherein the first substrate has a plurality of conductive pillars correspondingly inserted into the holes;
    removing the supporting material to expose the conductive pillars on the front surface;
    forming a patterned circuit on the front surface;
    attaching a second substrate on the patterned circuit; and forming a plurality of conductive structures on the first substrate.

2. The method according to claim 1, wherein the supporting material is formed on the front surface via a printing process.

3. The method according to claim 1, wherein after the step of forming the holes on the wafer, an adhesive is coated on the rear surface and fills the holes.

4. The method according to claim 1, wherein the step of forming the patterned circuit comprises:
sputtering a metal layer to connect the conductive pads and the conductive pillars exposed on the front surface.

5. The method according to claim 4, wherein the metal layer, the conductive pads and the conductive pillars include copper.

6. The method according to claim 1, wherein after the step of forming the patterned circuit on the front surface, an optical adhesive is coated on the front surface and covers the patterned circuit.

7. The method according to claim 6, wherein the optical adhesive includes an epoxy.

8. The method according to claim 1, further comprising:
singulating the package into a plurality of units.

9. The method according to claim 1, wherein the first substrate includes a glass.

10. The method according to claim 1, wherein the second substrate includes a glass.

11. The method according to claim 1, wherein the holes are formed via an etching process.

12. The method according to claim 1, wherein the first substrate has a plurality of contact pads, and the conductive structures are formed on the first substrate.

13. The method according to claim 1, wherein the conductive structures include a plurality of solder bumps.

* * * * *